United States Patent
Hohl et al.

(10) Patent No.: US 6,503,335 B2
(45) Date of Patent: Jan. 7, 2003

(54) CENTRIFUGE AND METHOD FOR CENTRIFUGING A SEMICONDUCTOR WAFER

(75) Inventors: Georg-Friedrich Hohl, Altötting; Roland Brunner, Reut; Susanne Bauer-Mayer, Burghausen; Günther Brunner, Haiming; Hans-Joachim Luthe, Kastl; Franz Sollinger, Polling, all of (DE)

(73) Assignee: Wacker Siltronic Gesellschaft für Halbleitermaterialien AG, Burghausen (DE)

(*) Notice: Subject to any disclaimer, the term of this patent is extended or adjusted under 35 U.S.C. 154(b) by 0 days.

(21) Appl. No.: 09/426,916

(22) Filed: Oct. 26, 1999

(65) Prior Publication Data

US 2002/0170576 A1 Nov. 21, 2002

(30) Foreign Application Priority Data

Nov. 12, 1998 (DE) ......................... 198 52 303
May 21, 1999 (DE) ......................... 199 23 385

(51) Int. Cl.⁷ ............................................. B08B 7/00
(52) U.S. Cl. ..................... 134/33; 134/17; 134/902; 34/312; 34/314; 34/318; 34/319; 34/323; 34/324; 494/37
(58) Field of Search ................... 134/17, 33, 902; 34/312, 314, 318, 319, 323, 324; 494/37

(56) References Cited

U.S. PATENT DOCUMENTS

| | | | |
|---|---|---|---|
| 4,313,266 A | 2/1982 | Tam | |
| 4,544,446 A * | 10/1985 | Cady | 156/639 |
| 4,871,417 A | 10/1989 | Nishizawa et al. | |
| 4,989,345 A * | 2/1991 | Gill Jr. | 34/58 |
| 5,882,433 A | 3/1999 | Veno | |
| 6,024,802 A | 2/2000 | Sung et al. | |
| 6,100,198 A * | 8/2000 | Grieger et al. | 438/692 |

FOREIGN PATENT DOCUMENTS

| | | |
|---|---|---|
| EP | 0434307 | 6/1991 |
| JP | 4-287922 | 10/1992 |
| JP | 5-152203 | 6/1993 |
| JP | 8-195375 | 7/1996 |
| JP | 9-38595 | 2/1997 |
| JP | 9-146079 | 6/1997 |
| JP | 9-199458 | 7/1997 |
| JP | 10-189412 | 7/1998 |
| JP | 10303173 | * 11/1998 |

OTHER PUBLICATIONS

G.Strasser et al. Reduction of particle contamination by controlled venting and pumping of vacuum loadlocks. J.Vac. Sci.Technol.A, vol. 8, No. 6, Nov./Dec. 1990.*
Merriam–Webster's Collegiate Dictionary. Tenth Edition. ISBN 0–87779–708–0, 1998. p. 653.*
Patent Abstract of Japan corresponding to JP 61–147535.
Patent Abstract of Japan corresponding to JP 1–069014.
Patent Abstract of Japan for JP 4–100231A is enclosed / Date: Apr. 2, 1992.
Patent Abstract corresp to JP 10–163 163 A / Date: Jun. 19, 1998.

* cited by examiner

Primary Examiner—Alexander Markoff
Assistant Examiner—M. Kornakov
(74) Attorney, Agent, or Firm—Collard & Roe, P.C.

(57) ABSTRACT

A centrifuge for a semiconductor wafer has a centrifuge plate for holding a semiconductor wafer, has a drive for setting the centrifuge plate in rotation, and has a device for supplying a medium to a front side and a rear side of the semiconductor wafer. The centrifuge has a housing which separates a centrifuging area and the semiconductor wafer from the environment, and a device for generating a laminar gas flow in the housing. A method for centrifuging a semiconductor wafer has the semiconductor wafer being centrifuged in a laminar gas flow.

9 Claims, 2 Drawing Sheets

CENTRIFUGE AND METHOD FOR CENTRIFUGING A SEMICONDUCTOR WAFER

BACKGROUND OF THE INVENTION

1. Field of the Invention

The present invention relates to a centrifuge for a semiconductor wafer and a centrifuging method carried out therewith.

2. The Prior Art

Centrifuges for semiconductor wafers are known. For example, EP-434,307 A2 describes a centrifuge which is used for drying a semiconductor wafer.

When using such a centrifuge, there is a risk of the semiconductor wafer being contaminated during centrifuging, for example by particles which emanate from the centrifuge. Rebounding of drops which have been centrifuged off onto dry points on the semiconductor wafer may also lead to recontamination.

SUMMARY OF THE INVENTION

It is an object of the present invention to provide an improved centrifuge in which this risk of recontamination is substantially eliminated.

A further object of the present invention is a method for centrifuging a semiconductor wafer, wherein the semiconductor wafer is centrifuged in a laminar gas flow.

The above objects are achieved according to the present invention by providing a centrifuge for a semiconductor wafer, having a centrifuge plate for holding the semiconductor wafer, having a drive for rotating the centrifuge plate, and having a device for supplying a medium to a front side and a rear side of the semiconductor wafer, which has a housing which separates a centrifuging area and the semiconductor wafer from the environment, and a device for generating a laminar gas flow in the housing.

The present invention ensures that the contamination from particles or other undesirable substances is minimal when the semiconductor wafer is being centrifuged. The invention may be used to dry the semiconductor wafer, and it may be used to treat it with a liquid, for example to rinse the semiconductor wafer with water. Particles are carried out of the housing of the centrifuge by a laminar gas flow. Liquids which are centrifuged radially off the semiconductor wafer are discharged downward along a sloping surface. Substances which were released from the liquid or particles which the liquid picked up are thus prevented from recontaminating the semiconductor wafer.

BRIEF DESCRIPTION OF THE DRAWINGS

Other objects and features of the present invention will become apparent from the following detailed description considered in connection with the accompanying drawings which discloses several embodiments of the present invention. It should be understood, however, that the drawings are designed for the purpose of illustration only and not as a definition of the limits of the invention.

In the drawings.

DETAILED DESCRIPTION OF PREFERRED EMBODIMENTS

Figure 1:
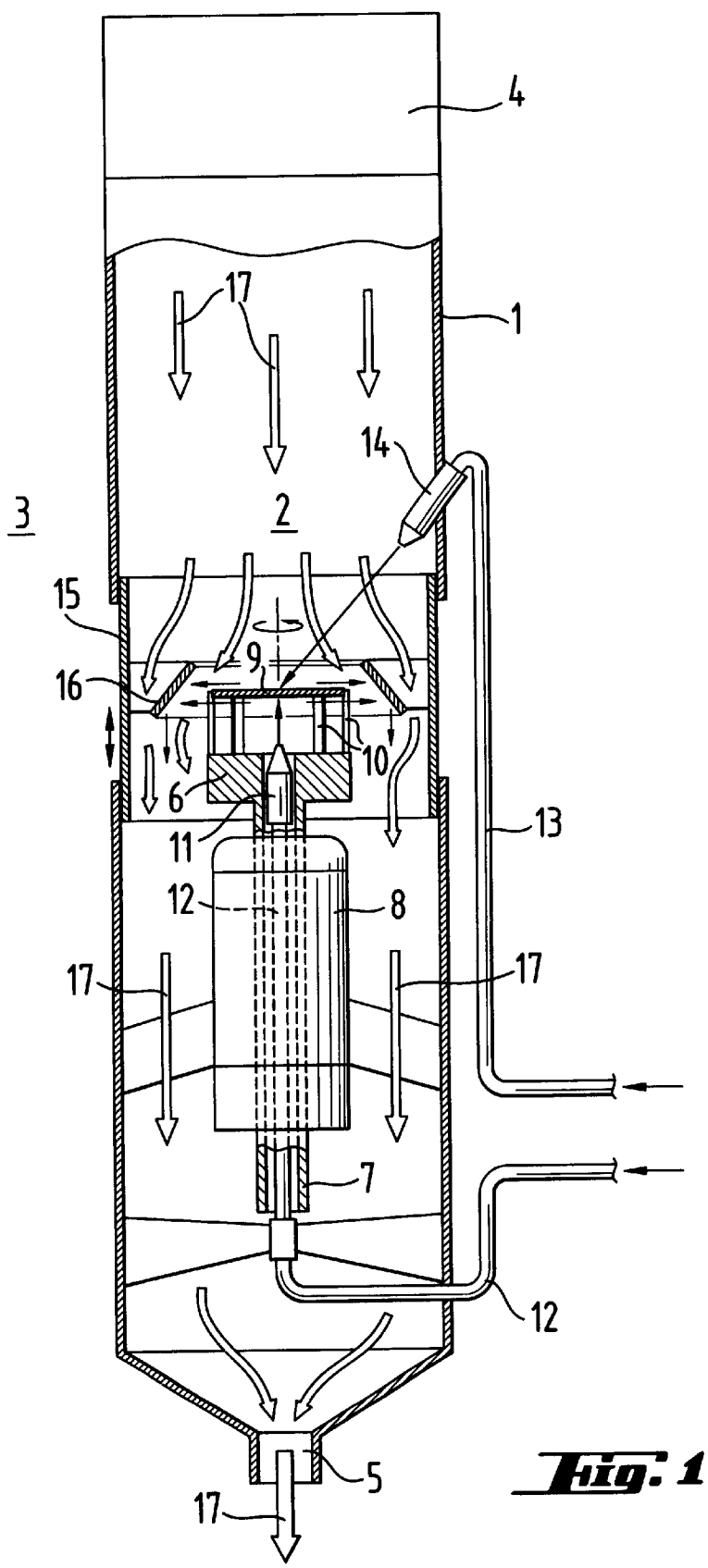
FIG. 1 shows a longitudinal section view of a centrifuge according to the invention.

Turning now in detail to the drawings, FIG. 1 shows a longitudinal section view through a centrifuge according to the invention. The centrifuge includes a housing 1 which hermetically separates a centrifuge area 2 from the external environment 3 outside of the centrifuge. In the upper part of the housing, there are inlet openings for a laminar gas flow 17, for example a laminar air flow. The air flow is generated, for example, by a conventional flow box 4 and is guided downwards through the tower-like housing to an outlet opening 5, it being possible to provide means for extracting the air flow at the outlet opening. In the centrifuging area 2, there is a centrifuge plate 6 which, in order to centrifuge a semiconductor wafer, caused to rotate by a drive 8, via a hollow shaft 7. The rotational speed of the centrifuge plate may be selected as desired and may be changed according to a defined program during centrifuging of the semiconductor wafer.

The semiconductor wafer 9 is held above the centrifuge plate 6 by holding arms 10, the rear side of the semiconductor wafer being at a distance of preferably at least 20 mm, particularly preferably at least 30 mm from the centrifuge plate. This distance contributes to avoiding contamination and ensuring rapid drying of the rear side of the semiconductor wafer. Preferably, 3 to 5 holding arms are provided, which fix the semiconductor wafer at its edge. Around the semiconductor wafer there is a ring 16 which diverts liquids which have been centrifuged off the semiconductor wafer downward into that part of the housing which lies below the semiconductor wafer. The ring is preferably in the form of part of a cone envelope and is dimensioned in such a way that the laminar gas flow 17 is not adversely affected. The distance between the edge of the semiconductor wafer and the wall of the housing is preferably at least 50 mm, particularly preferably at least 100 mm.

The internal diameter of the hollow shaft 7 is preferably at least 50 mm and thus offers sufficient space for holding means for supplying a medium along a supply route 12 to the rear side of the semiconductor wafer. These means comprise one or more nozzles 11, which are preferably arranged in the center of the centrifuge plate. This enables the medium which is supplied along the supply route 12 via feed lines to strike the center of the rear side of the semiconductor wafer and to be uniformly distributed over the rear side of the semiconductor wafer by centrifugal forces. This rules out the possibility of uneven treatment of the rear side, as well as of periodic interruption of the supply of medium by the holding arms which rotate during centrifuging. The nozzles 11 and the feed lines for supplying the medium do not rotate with the hollow shaft during centrifuging. A further medium supply is directed at the front side of the semiconductor wafer, for example along supply route 13. The means for supplying the medium comprise one or more nozzles 14 which are arranged above and to the side of the semiconductor wafer, for example on the wall of the housing 1, and feed lines along the feed route 13. The feed lines along the feed routes 12 and 13 may comprise gas and liquid lines, so that a gas and a liquid can also be supplied simultaneously to the semiconductor wafer.

Suitable media for supply to the semiconductor wafer are in particular gases, such as air, nitrogen or inert gases, and liquids, such as water and rinsing solutions.

Through a closable loading and unloading window 15, the semiconductor wafer is moved into the centrifuging area 2 and removed therefrom, preferably with the aid of a manipulator which holds the semiconductor wafer at its edge.

The invention is suitable in particular for rinsing and drying semiconductor wafers of large diameters of at least 200 mm. These semiconductor wafers are preferably centrifuged immediately after a polishing process, a cleaning process or a conditioning process, for example a hydrophilization of the surface.

When a semiconductor wafer is being dried by centrifuging, there is a risk of the semiconductor wafer being contaminated, for example by particles which emanate from the centrifuge. Furthermore, rebounding of drops which have been centrifuged off, for example drops of rinsing agent, onto dry points on the semiconductor wafer may lead to recontamination. Furthermore, spots of water should be prevented from remaining after the drying centrifuging.

According to a particularly preferred embodiment of the invention, it is therefore proposed to divide the centrifuging of the semiconductor wafer into a rinsing centrifuging and a drying centrifuging, in which case centrifuging is carried out during the rinsing centrifuging and during the drying centrifuging with a rotational speed profile which in each case contains at least one ramp, during which the rotational speed of the centrifuge is increased to a target speed, and the rotational speed of the centrifuge is reduced considerably prior to the drying centrifuging.

This method ensures that the contamination of the semiconductor wafer from particles or other undesirable substances is minimal.

During the rinsing centrifuging, the semiconductor wafer is brought into contact with a rinsing agent, in particular with water or with an aqueous solution which contains active rinsing substances, and is centrifuged at the same time. According to the invention, during this process the rotational speed of the centrifuge is increased continuously to a target speed and is reduced considerably prior to the drying centrifuging, which proceeds without a liquid being supplied. The rotational speed of the centrifuge is preferably reduced to <800, preferably <300 rpm. During the rinsing centrifuging, one or more ramps may be provided for increasing the rotational speed. Preferably, there is one ramp, during which, as the speed runs up to the target speed, at the same time the maximum rotational speed desired for rinsing centrifuging is reached.

Furthermore, it is preferable for the maximum speed of the centrifuge reached during rinsing centrifuging to be lower than the maximum speed reached during drying centrifuging. The drying centrifuging comprises one or more phases (ramps) during which the rotational speed of the centrifuge is increased. Preference is given to two ramps, in which case the rotational speed of the centrifuge is initially increased to an interim maximum and then to a principal maximum.

During the rinsing and drying centrifuging, the rotational speed of the centrifuge is preferably changed in a linear manner, although non-linear changes are also not ruled out.

It has proven particularly advantageous to carry out the rinsing centrifugingat least for some of the time in the presence of a substance which reduces the surface tension of water.

It is also advantageous, particularly in the case of a semiconductor wafer with a hydrophobic surface, to centrifuge the semiconductor wafer in the presence of ozone during the rinsing and/or drying centrifuging and, in this way, to form a protective oxide film.

EXAMPLE

Figure 2:
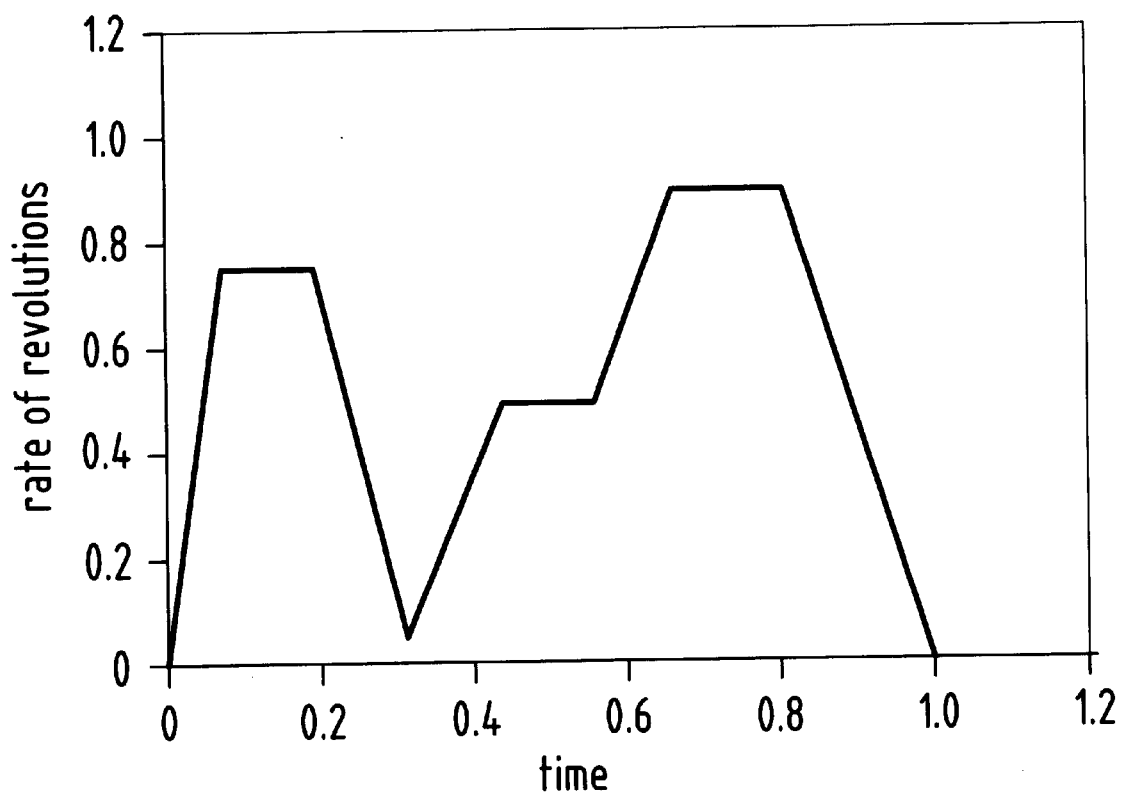
FIG. 2 shows the rotational speed as a function of time.

The following example is directed to a preferred embodiment of the method which refers to FIG. 2 which depicts the rotational speed of the centrifuge as a function of time. The method comprises the following steps:

a) Placing a damp semiconductor wafer, to which chemicals may have been applied, on a centrifuge. Fixing the semiconductor wafer by clamping the semiconductor wafer at a number of points on its edge.

b) Rinsing centrifuging of the semiconductor wafer. A rinsing agent, for example water, is applied to the top side and the underside of the semiconductor wafer via nozzles. The shape ot the nozzles is selected in much a manner that the medium strikes the semiconductor wafer at least in the center, and preferably from the center to the edge. The minimum amount of wafer dispensed is preferably from 0.1 to 4.0 l/min per nozzle. During the rinsing period, the water is accelerated to a desired maximum speed once it has passed through one or more ramps. As shown in FIG. 2, one ramp is preferred (rotational speeds and times are given in normalized units in FIG. 2). The ramp is perferably passed through at $\geq 1$ r/s$^2$, preferably $\geq 5$ r/s$^2$. The maximum rotational speed during the rinsing phase is >50 rpm, preferably at least 800 rpm. With the aid of the centrifugal force, cleaning agents which have previously been applied can be very effectively removed from the wafer. This force reduces the thickness of the layer of liquid which is situated directly on the surface of the wafer and in which the concentration of chemicals is reduced solely by diffusion. As a result, it is possible to reduce the amount of water required and to shorten the rinsing process.

c) Reducing the rotational speed during the rinsing process to a rotational speed which lies below the maximum speed, preferably at a rotational speed of <300 rpm. In this way, finely dispersed aerosol formed from the rinsing liquid is reduced. This is important in particular for semiconductor wafers with a large diameter of $\geq 200$ mm. This is because with diameters of this size, in the rotational speed range indicated, centrifugal forces which lead to an extremely high aerosol formation arise toward the edge within the rotational speed range indicated. The ramp for reducing the rotational speed is preferably passed through at $\geq 0.5$ r/s$^2$, preferably $\geq 2$ r/s$^2$.

d) Supplying a liquid to the rinsing liquid or supplying a vapor or a vapor-inert gas mixture or a vapor-gas mixture to the rinsing liquid. For example, this may be supplied by blowing the vapor or mixture onto the layer of rinsing liquid which forms on the semiconductor wafer during centrifuging. The liquid or the vapor comprises a water-soluble substance which reduces the surface tension of water, preferably a substance selected from the group consisting of the alcohols, particularly preferably a short-chain alcohol, such as isopropanol. The liquid or vapor is supplied throughout the entire time of rinsing centrifuging, preferably during the final phase of rinsing centrifuging, and if appropriate also at the beginning of the drying centrifuging. Prolonged supply of the liquid or the vapor during the drying centrifuging is to be avoided, since this may lead to the formation of water spots in the center of the semiconductor wafer. It is preferable for the concentration of the substance in the rinsing liquid to be $\leq 1$ mol/l, preferably $\leq 0.1$ mol/l. The inert gas or gas used may in particular be noble gases and nitrogen or carbon dioxide.

e) Beginning the drying centrifuging by increasing the rotational speed of the centrifuge to a maximum speed in one or more steps. According to the profile shown in the figure, the rotational speed is preferably initially increased to a rotational speed (interim maximum) at which the rinsing liquid is reduced to a residual thin layer of liquid. At this level, the rotational speed is below a value above which extremely fine liquid droplets (aerosols) are formed as a result of the swirling of water with air. The gradient of the ramp may be relatively flat. The final rotational speed when the interim maximum is reached is at most 1600 rpm, preferably at most 500 rpm. Then, the rotational speed of the centrifuge is increased to a final rotational speed (principal maximum) in at least one further ramp. The rise of the ramp is at most 15 r/s$^2$, preferably at most 7 r/s$^2$. The final speed is at most 3000 rpm, preferably at most 2000 rpm.

f) At the end of the drying centrifuging, the rotational speed of the centrifuge is reduced to 0 rpm and the dry semiconductor wafer is removed from the centrifuge.

The method described is distinguished in particular by the fact that the semiconductor wafer is rinsed efficiently and, in the process, rinsing agent and time are saved. Furthermore, the method described reduces the cycle time required for drying the semiconductor wafer. The use of a substance which reduces the surface tension of water during the rinsing and drying centrifuging reduces the number of particles on the surface of the semiconductor wafer.

The following Table I shows a test result:

TABLE I

|  | With addition of IPA gas[1] | Without addition of IPA gas |
|---|---|---|
| Average LLS addition[2] | 0.9 | 1.1 |

[1]IPA = isopropanol
[2]LLS addition = measured value indicating particles

The drying centrifuging of the semiconductor wafer in a plurality of steps at different rotational speeds and with different ramps reduces the formation of extremely fine liquid droplets (aerosols) and the deposition of such liquid droplets on the dry or partially dry semiconductor wafer, and thus actively prevents the formation of undesirable water spots and particles.

This can also be seen from the following Table II:

TABLE II

|  | Drying centrifuging with two ramps, max. speed 1800 rpm | Drying centrifuging with one ramp, max. speed 1800 rpm |
|---|---|---|
| Average LLS addition | 0.9 | 1.3 |

The following Table III proves that the rotational speed at the end of the rinsing phase is also of decisive importance for the levels of particle addition during drying.

TABLE III

|  | Rotational speed at the end of rinsing centrifuging 200 rpm | Rotational speed at the end of rinsing centrifuging 2000 rpm |
|---|---|---|
| Average LLS addition | 0.8 | 1.2 |

Accordingly, while a few embodiments of the present invention have been shown and described, it is to be understood that many changes and modifications may be made thereunto without departing from the spirit and scope of the invention as defined in the appended claims.

What is claimed is:

1. A method for centrifuging a semiconductor water comprising generating a laminar gas flow in a housing, said housing separates a contrifuging area and a semiconductor wafer from an external environment;

centrifuging said semiconductor wafer in said laminar gas flow in said housing;

supplying a medium to a frontside of the semiconductor wafer and to a rear side of the semiconductor wafer;

wherein the centrifuging of the semiconductor wafer comprises a rinsing centrifuging and drying centrifuging using a centrifuge, and during the rinsing centrifuging and the drying centrifuging, centrifuging is carried out using a rotational speed profile; and wherein said rotational speed profile during the rinsing cenitifuging contains a ramp, during which the rotational speed of the contrifuge is increased to a maximum speed, and during the drying centrifuging, two ramps are provided for increasing the rotational speed, the rotational speed of the centrifuge initially being increased to an interim maximum and then to a principal maximum.

2. The method as claimed in claim 1, comprising supplying the medium to the center of the rear side of the semiconductor wafer.

3. The method as claimed in claim 1, comprising having substances which are centrifuged radially off the semiconductor wafer striking a sloping surface within a centrifuge housing and being diverted downward.

4. The method as claimed in claim 1, comprising supplying the medium in order to rinse the semiconductor wafer.

5. The method as claimed in claim 1, comprising supplying the medium in order to dry the semiconductor wafer.

6. The method as claimed in claim 1, wherein the centrifuging of the semiconductor wafer comprises a rinsing centrifuging and drying centrifuging using a centrifuge, and during the rinsing centrifuging and the drying centrifuging, centrifuging is carried out using a rotational speed profile which in each case contains at least one ramp in which the rotational speed of the centrifuge is increased up to a target speed, and the rotational speed of the centrifuge is reduced prior to the drying centrifuging.

7. The method as claimed in claim 1, wherein the centrifuge, during the drying centrifuging, is rotated at a higher maximum speed than during the rinsing centrifuging.

8. The method as claimed in claim 1, wherein the rinsing centrifuging is carried out in the presence or a substance which reduces the surface tension of wafer.

9. The method as claimed in claim 1, wherein the semiconductor water is centrifuged in the presence of ozone.

* * * * *